US010512862B2

(12) United States Patent
Ferreira et al.

(10) Patent No.: US 10,512,862 B2
(45) Date of Patent: Dec. 24, 2019

(54) FILTER ELEMENT FOR WAFER PROCESSING ASSEMBLY

(71) Applicant: Veeco Instruments Inc., Plainview, NY (US)

(72) Inventors: Maria Ferreira, Somerset, NJ (US); Joseph Lamb, Somerset, NJ (US); Ankit Modi, Somerset, NJ (US); David Gant, Somerset, NJ (US)

(73) Assignee: VEECO INSTRUMENTS INC., Plainview, NY (US)

( * ) Notice: Subject to any disclaimer, the term of this patent is extended or adjusted under 35 U.S.C. 154(b) by 140 days.

(21) Appl. No.: 15/715,968

(22) Filed: Sep. 26, 2017

(65) Prior Publication Data

US 2019/0091616 A1   Mar. 28, 2019

(51) Int. Cl.
| | | |
|---|---|---|
| *B01D 46/00* | (2006.01) | |
| *F01N 3/022* | (2006.01) | |
| *B01D 39/16* | (2006.01) | |
| *C23C 16/44* | (2006.01) | |

(52) U.S. Cl.
CPC ...... *B01D 39/1692* (2013.01); *C23C 16/4412* (2013.01); *B01D 2239/125* (2013.01)

(58) Field of Classification Search
CPC .............. B01D 46/00; B01D 46/0075; B01D 39/1692; B01D 2239/125; C23C 16/4412; F01N 3/022; F01N 3/0233; F01N 3/0237; F01N 2450/30

USPC ....... 55/385.3, 497, 498, 520, 521, DIG. 28; 118/715; 123/198 E; 427/255.28
See application file for complete search history.

(56) References Cited

U.S. PATENT DOCUMENTS

| | | | | |
|---|---|---|---|---|
| 3,420,377 | A | * 1/1969 | Vandersip | B01D 27/06 210/315 |
| 4,756,727 | A | 7/1988 | Howeth | |
| 5,873,920 | A | * 2/1999 | Wong | B01D 46/2411 55/385.3 |
| 5,954,847 | A | * 9/1999 | Shively | B01D 46/2411 123/198 E |
| 9,764,965 | B1 | * 9/2017 | Nohren, Jr. | B01D 46/527 |
| 2014/0008285 | A1 | * 1/2014 | Nohren, Jr. | B01D 63/14 210/321.77 |
| 2015/0075431 | A1 | 3/2015 | Barriss et al. | |
| 2015/0322566 | A1 | * 11/2015 | Goeres | C23C 16/4412 118/715 |
| 2018/0001247 | A1 | * 1/2018 | Jinka | B01D 39/1623 |

* cited by examiner

*Primary Examiner* — Minh Chau T Pham
(74) *Attorney, Agent, or Firm* — Holzer Patel Drennan

(57) ABSTRACT

Filter elements for gaseous fluid (e.g., air) filtration for wafer processing systems. The filter elements have a pleat ratio of no greater than 7, where the pleat ratio is the number of pleats per mean diameter of the filter. By having a pleat ratio no greater than 7, and in some implementations also greater than 5, the filter is optimized for wafer processing systems and methods. This pleat ratio optimizes the spacing between pleats, thus balancing filtration media area against effective area, such as what might be lost due to contaminant bridging.

20 Claims, 3 Drawing Sheets

FILTER ELEMENT FOR WAFER PROCESSING ASSEMBLY

BACKGROUND

Filter elements have long been used to remove particulate material from fluid streams, including gaseous fluid streams such as air. Depending on the particular implementation and the performance desired of the filter element, the design, configuration, and/or construction of the filter element will differ.

SUMMARY

The technology described herein is directed to filter elements for gaseous fluid (e.g., air) filtration for wafer processing systems. The filter elements have a pleat ratio of no greater than 7, where the pleat ratio is the number of pleats per mean diameter of the filter.

One particular implementation described herein is a gaseous fluid filter element having an extension of filtration media extending from a first end to a second end opposite the first end, the filtration media forming a plurality of pleats extending circumferentially around the filter element, the plurality of pleats defining an inner diameter and an outer diameter, with the filter element having a pleat ratio of no greater than 7, in other implementations no greater than 6.5. In some implementations, the pleat ratio is at least 5.

Another particular implementation described herein is a wafer processing assembly having therein a filter element therein, the filter element for filtering gaseous exhaust from a processing chamber upstream of a pump. The filter element comprises an extension of filtration media extending from a first end to a second end opposite the first end, the filtration media forming a plurality of pleats extending circumferentially around the filter element, the plurality of pleats defining an inner diameter and an outer diameter, with the filter element having a pleat ratio of no greater than 7.

Yet another particular implementation described herein is a method of cleaning exhaust from a wafer processing assembly. The method includes passing atmosphere from a processing chamber of the wafer processing assembly through a filter element having a pleat ratio no greater than 7 to form a filtered exhaust, and pumping the filtered exhaust.

These and various other implementations, features and advantages will be apparent from a reading of the following detailed description.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Figure 1:
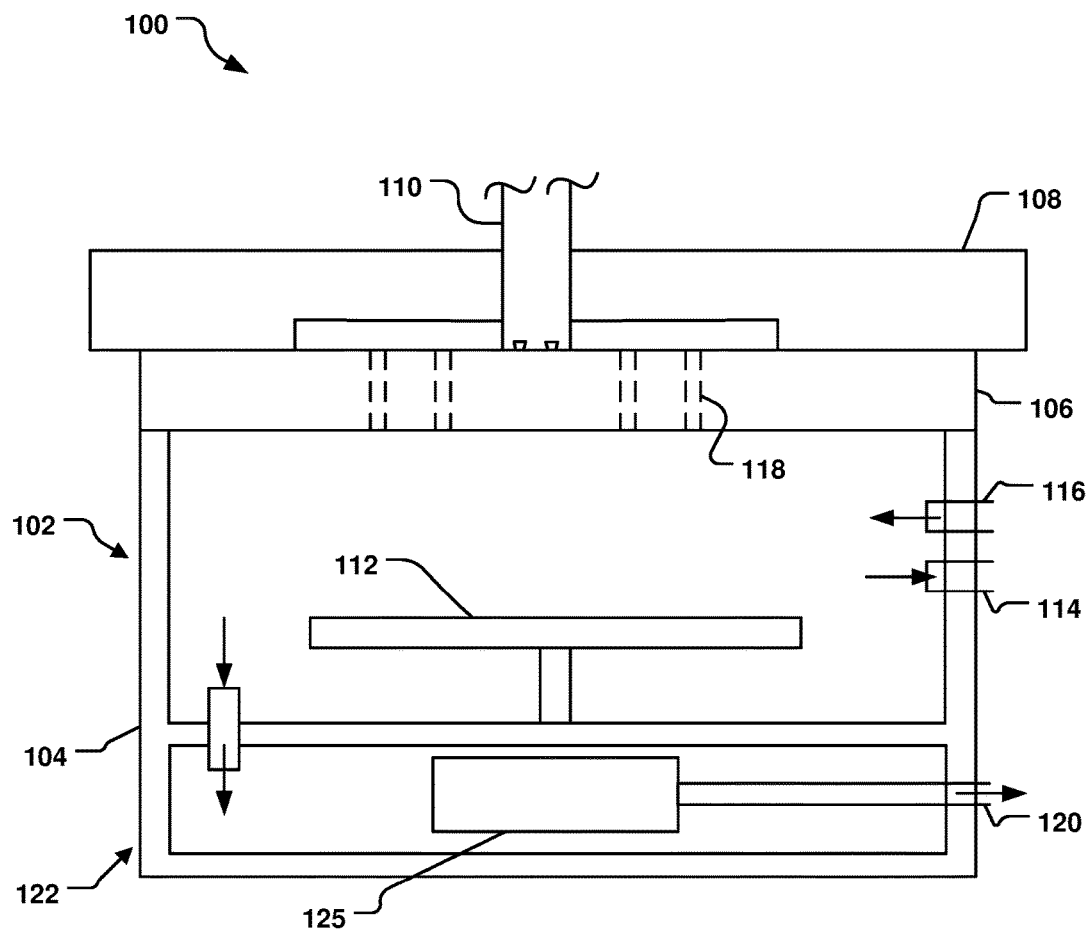
FIG. 1 is a schematic, cross-sectional side view of a generic wafer processing assembly.

The present description is directed to fluid filters, particularly gas (e.g., air) filters for use with wafer processing assemblies and/or systems. The wafer processing system can be, for example, a CVD (chemical vapor deposition) system, MOCVD (metal organic CVD) system, ion beam deposition system, ion beam sputtering system, chemical etching system, ion milling system, physical vapor deposition (PVD) system, DLC (diamond-like carbon) deposition system, or other processing system.

In the following description, reference is made to the accompanying drawing that forms a part hereof and in which are shown by way of illustration specific implementations. The description provides additional specific implementations. It is to be understood that other implementations are contemplated and may be made without departing from the scope or spirit of the present invention. The following detailed description, therefore, is not to be taken in a limiting sense. While the present invention is not so limited, an appreciation of various aspects of the invention will be gained through a discussion of the examples provided below.

As used herein, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", "on top", etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

In some instances, a reference numeral in a figure may have an associated sub-label consisting of an upper-case letter to denote one of multiple similar components. When reference is made to a reference numeral without specification of a sub-label, the reference is intended to refer to all such multiple similar components.

FIG. 1, in a very basic manner, illustrates a wafer processing system 100, such as a CVD system. The particular system 100 is not paramount to the filters of this disclosure, but is provided as a generic wafer processing system in which a filter of this disclosure can be incorporated. The particular system 100 has only some parts shown, and shown generically with no particular design; it is to be understood that an actual CVD system or other wafer processing system has significantly more features present.

The wafer processing system 100 has a chamber 102 formed by, at least, a first part 104 and a second part 106 in which a wafer (not illustrated) is positioned for processing. In the particular implementation, the chamber 102 has a cylindrical volume, formed by a cylindrical first part 104 mated with a circular second part 106 with a seal (not shown) therebetween. The processing in the chamber 102 may be, for example, for deposition of metal oxide film(s) on the wafer. A lid 108 is shown over the second part 106. A center hub 110 is present through the lid 108 extending to the second part 106.

Present within the chamber 102 is a substrate support 112 for positioning a wafer thereon or therein during processing. Although not shown, the system 100 will include an access into the chamber 102 for moving the wafer into and out from the chamber 102.

Depending on the particular processing system, the system 100 may also include an evacuation source 114, for pulling a vacuum on the chamber 102, and gas feeds 116, 118, for proving (e.g., reactive) gas to the chamber 102. The system 100 may also include an exhaust 120, to maintain desired atmosphere quality in the chamber 102 and/or otherwise maintain a circulation within the chamber 102. Gaseous atmosphere (e.g., air) from the chamber 102 leaves the chamber 102 via the exhaust 120 and, in some implementations, is vented to the outside atmosphere. However, to inhibit processing material from escaping and contaminating the outside atmosphere, at least one filter element 125 is in fluid communication with and between the chamber 102 and the exhaust 120. The filter element 125 is configured to remove at least particulate (solid) contaminants from the exhaust stream prior to it being vented. In this particular illustration, the filter element 125 is in a separate chamber 122 fluidly connected to the chamber 102, although in other implementations the filter element 125 may be physically positioned in the chamber 102. After the exhaust stream has been cleaned by the filter element 125, the exhaust stream can be vented.

In some implementations, the evacuation source 114 and the exhaust 120 are combined, so that the atmosphere that is removed from the chamber 102 to obtain the vacuum is vented to the atmosphere.

For either situation, the filter element 125 is positioned between the interior of the chamber 102 and a pump (e.g., vacuum pump) used to remove the air from the chamber (the pump not being shown in FIG. 1). Having the filter element 125 upstream of the pump protects the pump from contaminants and increases the working life of the pump in addition to removing the contaminants prior to being vented.

Figure 2:
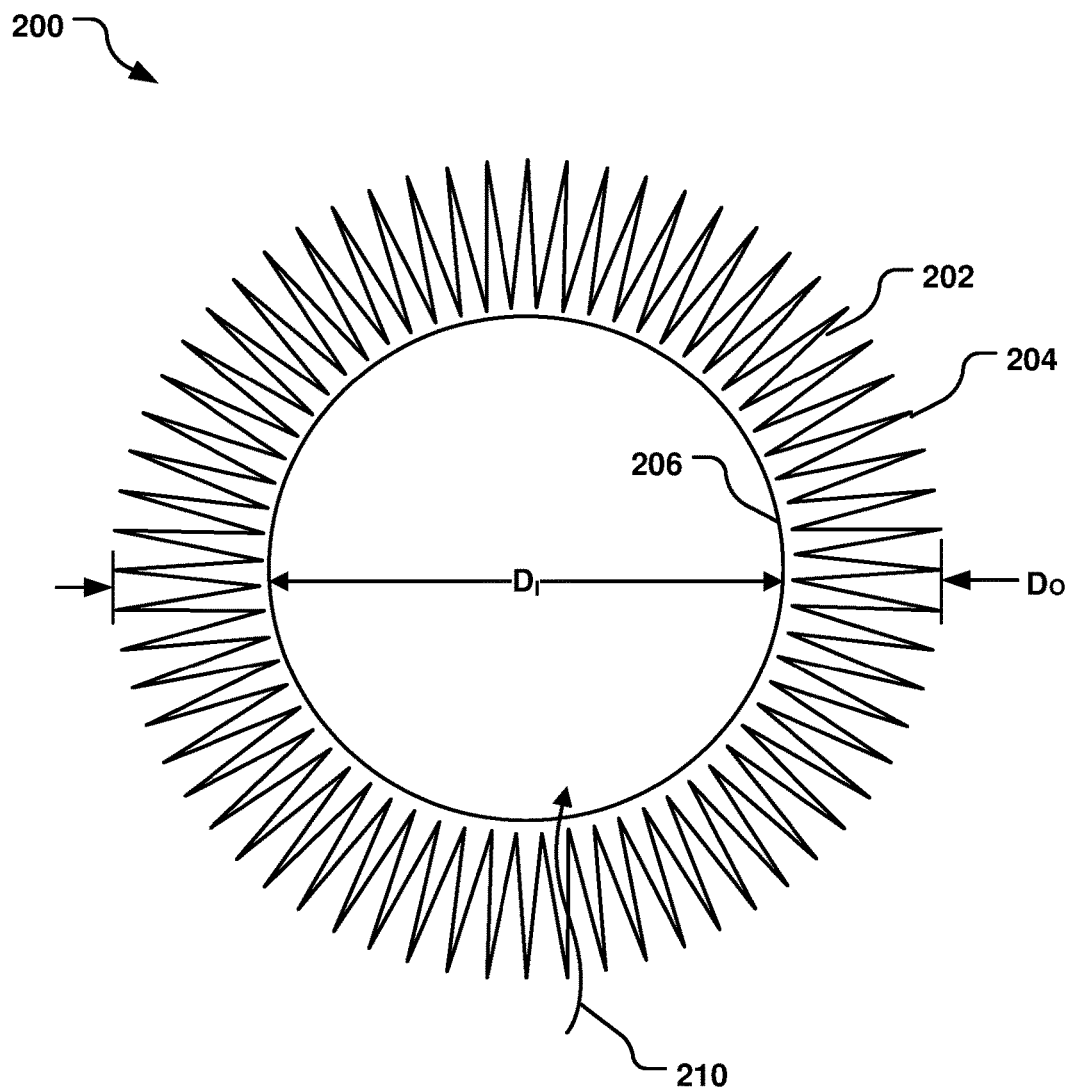
FIG. 2 is a schematic, cross-sectional top view of a filter element.

FIG. 2 illustrates an example filter element 200 for removing contaminants from a gaseous fluid flow. The filter element 200 has filtration media formed into a plurality of pleats 202, each pleat 202 having a tip 204 and a base 206. Each pleat 202 typically extends from one end of the filter element 200 to the other end, so that the pleat 202 extends the entire length of the filter element 200. The filter element 200 has a circular cross-section, as shown in FIG. 2, having an interior diameter $D_I$ defined by the bases 206 of the pleats 202 and an outer diameter $D_O$ defined by the tips 204 of the pleats 202. The filter element 200 may be a cylinder, a tapered cylinder (truncated cone), a cone, or have an irregular shape having a circular cross-section. Filter elements having a circular cross-section are often referred to as "tubular" filter elements.

The filter element 200 has a pleat ratio, which provides for the maximum useful cross-sectional area for a given volume of the filter element 200. The pleat ratio is defined as the number of pleats per mean diameter of the filter; that is, the number of pleats divided by $(D_I+D_O)/2$. As an example, a filter element having a $D_I$ of 9.0 inches, a $D_O$ of 14.625 inches, having 102 pleats (with a pleat height of 2.8125 inches), has a pleat ratio of 8.63, whereas the same sized filter having 64 pleats has a pleat ratio of 5.42. As another example, a filter element having a $D_I$ of 6.0 inches, a $D_O$ of 9.75 inches, having 70 pleats (with a pleat height of 1.875 inches), has a pleat ratio of 8.89, whereas the same sized filter having 48 pleats has a pleat ratio of 6.10. Another example has a filter element with a pleat ratio of 8.83 being reduced to a ratio of 5.42.

The filter media may be, e.g., paper, other cellulosic material, synthetic material, or any combinations thereof. The filter media may be a perforated mat or a fibrous mat or web formed from polymeric or cellulosic fibers. The filter media can be treated in any number of ways to improve its efficiency in removing minute particulates; for example, electrostatically treated media can be used, as can cellulose or synthetic media or a combination thereof having one or more layers of fine fiber sized on the order of micron or sub-micron (fiber diameter), or other types of media known to those skilled in the art.

Gaseous atmosphere (e.g., air) flows through the filter media and the filter element 200, in this implementation, radially inward through the pleated media, identified as air flow path 210. Particulate, too large to pass through the filter media, are captured by the media on the surface of the pleats 202. Filtered air exits from the interior volume of the filter element 200.

Pleat-type filter elements, such as the filter element 200, can be used to filter particulate contaminant from the exhaust stream of wafer processing systems (e.g., MOCVD). The filter element 200 can be designed depending on the type of contaminants to be removed from the fluid (e.g., gas) stream being filtered. An example particulate contaminant in the exhaust stream of a wafer processing system (e.g., MOCVD) is GaN dust, a byproduct of the wafer processing. Other contaminants that can be removed from the gaseous fluid stream by the filter element 200 include dust, dirt, pollen, metal chips and/or shavings, and the like. Some particulates may be doubly harmful to the operation of the wafer processing system, both as the physical particle and the molecular structure of the particle.

Figure 3:
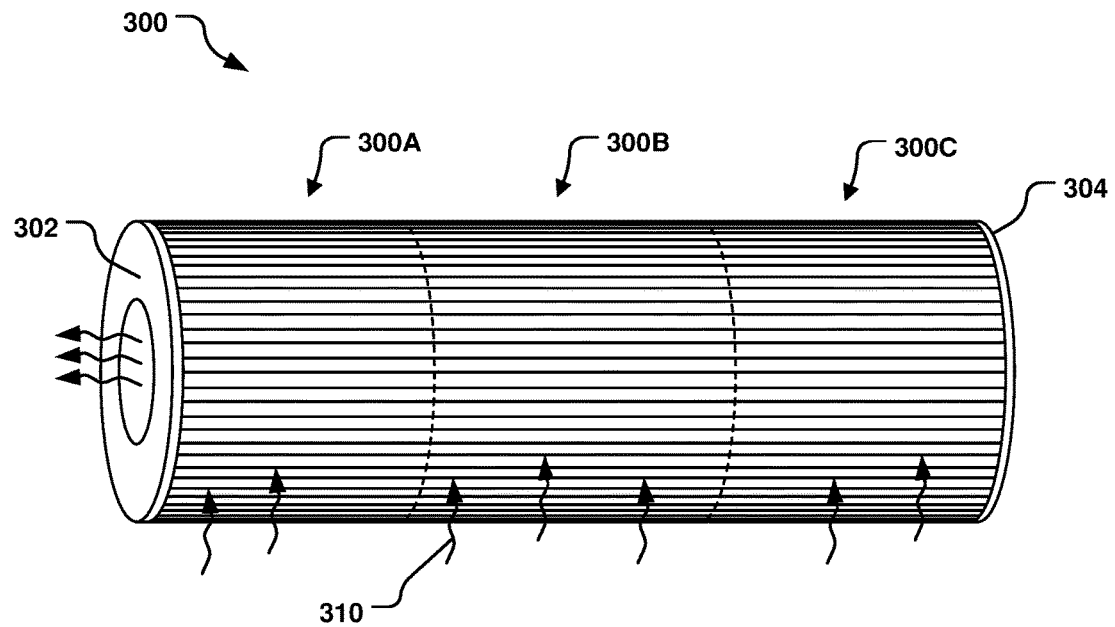
FIG. 3 is a side perspective view of a filter element configuration.

FIG. 3 illustrates an example orientation of a filter element construction 300, in the particular implementation, three individual filter elements 300A, 300B, 300C positioned end-to-end. The filter element construction 300 has a first end 302 and a second end 304; in this particular implementation, the first end 302 is an "open" end and the second end 304 is a closed end. Although the first end 302 is referred to an "open" end, the entire surface of the end 302 may not be open, but only a sufficient amount to allow air flow to pass through the end 302. For example, the open end 302 may have a central aperture. Filter media 306, forming a plurality of pleats 308, extends from the first end 302 to the second end 304. The filter element construction 300 has an interior volume defined by the individual filter elements 300, the first end 302 and the second end 304.

When positioned in a wafer processing assembly (e.g., assembly 100 of FIG. 1), the filter construction 300 may be positioned in a horizontal orientation, as shown in FIG. 3 and schematically shown in FIG. 1. Gaseous fluid (e.g., air) flow enters the interior volume by passing through the media, into the interior volume, and exiting the interior volume via the open end 302. The incoming air and the outgoing air, shown as the air flow path 310, is shown in FIG. 3; the flow path 310 is radially inward through the filter media 306 into the filter's interior volume and out via the open end 302.

In accordance with this disclosure, the filter element 200, 300 has a pleat ratio of no more than 7. As explained above in reference to FIG. 2, the pleat ratio is the number of pleats per mean diameter of the filter, or, the number of pleats divided by $(D_I+D_O)/2$. Several examples of pleated filter configurations and their pleat ratios are also provided above in reference to FIG. 2. In some implementations, the pleat ratio is no greater than 6.9 or 6.8 or 6.75 or 6.7 or 6.6 or 6.5 or 6.4 or 6.3 or 6.25 or 6.2 or 6.1 or even no greater than 6. In other implementations, the pleat ratio is no more than 5.9 or 5.8 or 5.75 or 5.7 or 5.6 or 5.5 or 5.4 or 5.3 or 5.2 or 5.25 or 5.1 or even no more than 5. In general, the pleat ratio is at least 2, and in some implementations at least 2.5, in other implementations at least 3, in other implementations at least 3.5, and in other implementations at least 4 or at least 5. In some implementations, the pleat ratio is between 5 and 6.5, in other implementations between 5 and 6.

The pleats in filter elements increase the filtration area over an unpleated filter, and the pleats thereby increase filter capacity and hence lifetime. However, too many pleats can actually reduce filter lifetime even though the filter media area is increased. Too few pleats (approaching a simple cylinder at the limit) will have very little area and lifetime. The pleat ratio defines this sweet spot that maximizes filter lifetime.

The pleat ratio provides a quantification of the optimum (or close to optimum) useful filter cross-sectional area for a given volume. The pleat ratio can be adjusted by adjusting any or all of the number of pleats, the inner diameter ($D_I$), and the outer diameter ($D_O$). To decrease the pleat ratio, the number of pleats can be decreased, the inner diameter ($D_I$) can be increased, and/or the outer diameter ($D_O$) can be increased. Because the filter element in a system (e.g., the filter element 125 in the system 100) has a certain form factor (e.g., volume, length, width, etc.), adjusting the number of pleats can readily be done to affect the pleat ratio. The desired pleat ratio for a certain filter may differ based on the type of materials being filtered, the gaseous fluid being filtered, and to some extent, the type of filter media used.

Depending on the particular application, the mean diameter of the filter (i.e., $(D_I+D_O)/2$) is at least 6 inches, in some implementations at least 7 inches. Other suitable examples of mean diameters are 8 inches, 9 inches, 10 inches, 11 inches, 12 inches. The mean diameter of the filter element closely represents the 2-dimensional filtration area of the filter, which differs from the pleat height, which does not account for the size of the filter (the inner diameter ($D_I$) and the outer diameter ($D_O$)). This subtle difference between the mean diameter and the pleat height is one of the keys to pleat ratio—a figure of merit uniquely characterizing a filter that incorporates filter area and pleat spacing.

The inner diameter and the outer diameter can have a difference of at least 1 inch, in some implementations, at least 2 inches and in other implementations at least 3 inches. Too short of a pleat does not provide a sufficient surface area of filtration media, decreasing the effectiveness of the filter element.

The inner diameter and the outer diameter have a difference of no more than 6 inches to 9 inches, in some implementations, no more than about 4 inches. Too tall of a pleat may have a tendency to sag or fold, decreasing the effectiveness of the filter element. Additionally, a large pleat height increases the outer diameter $D_O$, which directly affects the form factor of the filter element, which is related to the volume available in the system to receive the filter element, packaging and storage of the filter element, etc.

In some implementations, a permeable support (e.g., a screen) can be present on the outer surface and/or the inner surface of the pleats, particularly for larger pleats, to support the pleats and/or protect the media.

The number of pleats will largely depend on the circumference of the filter (or, the outer diameter, $D_O$, of the filter), but will usually be at least 30 pleats or at least 40 pleats or at least 50 pleats, and/or no more than about 90 pleats or no more than 80 pleats. Other examples include 35-75 pleats, 40-80 pleats, 40-60 pleats, 45-65 pleats.

The number of pleats, particularly the lower limit, is dependent on the gaseous fluid flow through the filter element and the allowable pressure drop. A filter element has to have enough area to flow the required gas therethrough for some period of time with a maximum pressure drop that is application specific, and that is determined by analysis of the exhaust stream and amount of particulate to be trapped. Having more pleats and thus more media area extends the time between filter changes, however if the pleat ratio is exceeded then the additional area may actually shorten the filter element lifetime.

By decreasing the number of pleats while maintaining the same mean diameter, the overall media area decreases. However, although the overall media area decreases, the effective media area increases.

When less surface area of media is used for the same amount of fluid (e.g., gas) stream, the particulate contaminants have less area on which to be captured, and thus resulting in more contaminant build-up on the media. Having a pleat ratio of no more than 7 was surprisingly found to decrease the rate of increasing pressure drop across the filter ($\Delta P$) (e.g., the filter element was slower to 'clog' and become occluded), rather than increasing the pressure drop, compared to a filter having the same mean diameter and greater number of pleats (this, a higher pleat ratio). Having a lower pressure drop, or, a slower rate of increasing pressure drop, extends the efficiency and productivity of the filter.

The pressure drop across the filter ($\Delta P$) can be used to measure filter performance and trigger maintenance cycles for the equipment being protected (e.g., MOCVD or other wafer processing system). As the filter element captures contaminant, flow through the filter element and therefore through the entire system is progressively reduced as pressure drop across the filter increases. As the pressure drop increases, the pump has to work harder to move the same volume of air. For typical filter element configurations, reducing the level of filtration (e.g., increasing the size and/or number of particles that pass the filter, e.g., by changing the media or treatment thereof) can maintain low $\Delta P$ longer, providing longer filter life and maintenance cycles, but in turn will significantly reduce vacuum pump lifetime due to the size and/or amount of particles passing through the filter to the pump. Higher filtration levels are easily achievable to provide better protection for the pump, but require more frequent filter changes and additional system maintenance. Thus, reducing $\Delta P$ without sacrificing the level of filtration is ideal. Having a pleat ratio of no more than 7 was surprisingly found to decrease the increase of pressure drop across the filter ($\Delta P$) without needing to decrease the level of filtration.

Indeed, having a pleat ratio of no more than 7 was surprisingly found to not only decrease the rate of increasing pressure drop across the filter ($\Delta P$) but also to increase the level of filtration available, by allowing use of finer media that can remove smaller sized particulate from the gaseous fluid stream and/or by extending the lifetime of the filter element. Applicant believes this is a direct effect of the "pleat ratio" effect; with an optimum pleat ratio, the filter element has more effective media available due to optimum spacing between the pleats. During a filtration process, all of the available area of the filter media is utilized, so that the pressure drop grows more slowly than when the spacing between adjacent pleats is less. This allows more filtration because of the increased effective filter area, allowing for removal of smaller particles and/or longer filtration life.

Because of the slower increase in pressure drop and increased effective media area for a pleat ratio of no more than 7, a finer filter media can be used; filter elements with ratios higher than 7 would load too quickly and hit $\Delta P$ too soon. Using the same filter media, in a filter element with a pleat ratio no more than 7, results in a filter element that loads more slowly while providing better protection for downstream elements.

Although not to be bound to this theory, Applicant believes that one or both of the decrease the pressure drop across the filter (ΔP) and the increase in filtration, either in reduction of particulate size or extended filter life, are due to optimized spacing between pleats. In some implementations, this may be due to the additional volume between adjacent pleats to receive and hold particulate contaminant. Additionally, greater spacing between pleats decreases the occurrence of contaminant bridging between adjacent pleats. Inhibiting contaminant bridging increases the available filtration media area (effective media area) and extends the filter life providing a slower increase in pressure drop.

Applicant found that for wafer deposition systems (e.g., CVD, MOCVD), for the tools, systems, and methods that are in current use, filter elements having a pleat ratio no more than 7 is optimum. However, there is an optimum pleat ratio for every application, based on fluid being filtered, contaminant being removed therefrom, fluid flow rate, etc. Applicant found that filters can be specifically designed to meet the ratio determined for the application.

As explained above, having a pleat ratio of no more than 7 (in some implementations, no more than 6.5, or no more than 6.2, or no more than 6, etc.) results in the unique ability to provide both long filter lifetime and high filtration levels. Increased filtration levels result in an extended pump life and decreased pump maintenance costs. The optimization also allows an extended maintenance cycle (e.g., filter lifetime and associated parts, chamber cleaning, etc.) in concert with the use of high filtration levels (e.g., passing smaller sized particles and fewer of them). This unique combination of high filtration and long maintenance cycles reduces overall cost of ownership of the wafer processing system, since maintenance cycles are a significant part of the overall cost of ownership. Not only does the maintenance activity itself have a cost (e.g., cost of the new filter element, other seals or equipment (e.g., pump) that might have to be replaced, cost of the service technician, lost productivity due to the system being out of production service, etc.), each time a reactor or other wafer processing system is serviced, the system does not return to full production capacity until several runs after the maintenance. All or part of the first few runs is scrap material, adding to lost material, time, productivity, etc.

By extending the filter element lifetime, the number and frequency of maintenance cycles performed is reduced. Additionally, longer lifetime of the filter element results in fewer filter elements, and parts associated with filter element changes, being used and disposed over the same period. Vacuum pump lifetime is also protected and extended as compared to lower filtration levels, further improving cost of ownership.

The following comparison was done between filter #1, a filter element with a $D_I$ of 6.0 inches, a $D_O$ of 9.75 inches, with 70 pleats, thus having a pleat ratio of 8.89, and filter #2, a same sized filter having 48 pleats and thus a pleat ratio of 6.10.

Each of the filter elements #1 and #2 were installed in a MOCVD wafer processing system. The pressure drop across the filter after one processing run was measured and recorded. "X" number of runs were completed, and the pressure drop across the filter after "X" processing runs was measured and recorded. After these "X" runs, the reactor was cleaned without changing the filter element. "Y" additional runs were completed, and the pressure drop across the filter after "Y" processing runs was measured and recorded.

| Filter #1 pleat ratio = 8.89 | | Filter #2 pleat ratio = 6.10 | |
| --- | --- | --- | --- |
| Run | ΔP (torr) | Run | ΔP (torr) |
| 1 | 11.60 | 1 | 10.00 |
| X = 111 | 16.20 | X = 151 | 15.92 |
| Y = 131 | 21.80 | Y = 96 | 19.89 |
| Total runs 242 | | Total runs 247 | |

In general, based on runs using different sized filter elements under various conditions, it was found that a filter having a pleat ratio of greater than 7 (e.g., 8.89) had a typical lifetime of less than 125 runs and provided a filtration level of 25 micrometers, whereas the same size and shape filter, but having less pleats to provide a pleat ratio of no more than 7 (e.g., 6.10), had a lifetime of greater than 240 runs and provided a filtration level of 5 micrometers.

In sum, the present disclosure provides a filter element, for removing particulate contaminant from gaseous fluid (e.g., air), that has a pleat ratio of no more than 7 and in some implementations more than 2, 3 or 4.

The above specification and examples provide a complete description of the structure, features and use of exemplary implementations of the invention. Since many implementations of the invention can be made without departing from the spirit and scope of the invention, the invention resides in the claims hereinafter appended. Furthermore, structural features of the different implementations may be combined in yet another implementation without departing from the recited claims.

What is claimed is:

1. A gaseous fluid filter element for a wafer processing system, the filter element comprising an extension of filtration media extending from a first end to a second end opposite the first end, the filtration media forming a plurality of pleats extending from the first end to the second end and circumferentially around the filter element, the plurality of pleats defining an inner diameter and an outer diameter, with the filter element having a pleat ratio of no greater than 7, the pleat ratio defined as the number of pleats per mean diameter of the filter in inches, the pleat ratio of no greater than 7 providing a slower rate of increasing pressure drop for the filter when in use in the wafer processing system compared to a filter having a pleat ratio greater than 7.

2. The filter element of claim 1 having a radially inward gaseous fluid flow through the filtration media.

3. The filter element of claim 1, wherein the pleat ratio is no greater than 6.5.

4. The filter element of claim 1, wherein the pleat ratio is no greater than 6.

5. The filter element of claim 1, wherein the pleat ratio is at least 5.

6. The filter element of claim 1, wherein the pleat ratio is 5-6.

7. A wafer processing assembly having therein a filter element therein, the filter element for filtering gaseous exhaust from a processing chamber upstream of a pump, the filter element comprising an extension of filtration media extending from a first end to a second end opposite the first end, the filtration media forming a plurality of pleats extending circumferentially around the filter element, the plurality of pleats defining an inner diameter and an outer diameter, with the filter element having a pleat ratio of no greater than 7, the pleat ratio defined as the number of pleats per mean diameter of the filter in inches, the pleat ratio of no greater than 7 providing a slower rate of increasing pressure drop for the filter in the wafer processing assembly compared to a filter having a pleat ratio greater than 7.

8. The wafer processing assembly of claim 7, wherein the filter element is oriented in a horizontal position with a radially inward gaseous flow path through the filter element.

9. The wafer processing assembly of claim 7, wherein the pleat ratio is no greater than 6.5.

10. The wafer processing assembly of claim 7, wherein the pleat ratio is no greater than 6.

11. The wafer processing assembly of claim 7, wherein the pleat ratio is at least 5.

12. The wafer processing assembly of claim 7, wherein the assembly is a MOCVD assembly.

13. A method of cleaning exhaust from a wafer processing assembly, comprising:
 passing atmosphere from a processing chamber of the wafer processing assembly through a filter element having a pleat ratio no greater than 7 to form a filtered exhaust, the pleat ratio defined as the number of pleats per mean diameter of the filter in inches, the pleat ratio of no greater than 7 providing a slower rate of increasing pressure drop for the filter compared to a filter having a pleat ratio greater than 7, and
 pumping the filtered exhaust out from the wafer processing assembly.

14. The method of claim 13, comprising:
 passing the atmosphere from the processing chamber of the wafer processing assembly to a filtering chamber separate from the processing chamber, the filtering chamber having the filter element therein.

15. The method of claim 14, further comprising:
 passing the atmosphere through the filter element extending horizontally in the filtering chamber.

16. The method of claim 15, wherein the filter element comprises three filter elements extending horizontally in the filtering chamber.

17. The method of claim 15, comprising passing the atmosphere radially inward through media of the filter element.

18. The method of claim 13, wherein passing the atmosphere from the processing chamber of the wafer processing assembly through the filter element having a pleat ratio no greater than 7 provides an extended efficiency and longer life for the filter compared to a filter having a pleat ratio greater than 7.

19. The filter element of claim 1, the pleat ratio of no greater than 7 providing an extended efficiency and longer life for the filter compared to a filter having a pleat ratio greater than 7.

20. The wafer processing assembly of claim 7, the pleat ratio of no greater than 7 providing an extended efficiency and longer life for the filter in the wafer processing assembly compared to a filter having a pleat ratio greater than 7.

\* \* \* \* \*